United States Patent
Chen et al.

(10) Patent No.: US 8,941,175 B2
(45) Date of Patent: Jan. 27, 2015

(54) POWER ARRAY WITH STAGGERED ARRANGEMENT FOR IMPROVING ON-RESISTANCE AND SAFE OPERATING AREA

(71) Applicant: United Microelectronics Corp., Hsin-Chu (TW)

(72) Inventors: Wei-Lin Chen, Changhua County (TW); Ke-Feng Lin, Taipei (TW); Chiu-Ling Lee, Hsinchu (TW); Chiu-Te Lee, Hsinchu County (TW); Chih-Chung Wang, Hsinchu (TW); Hsuan-Po Liao, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/918,994

(22) Filed: Jun. 17, 2013

(65) Prior Publication Data

US 2014/0367789 A1 Dec. 18, 2014

(51) Int. Cl.
*H01L 29/06* (2006.01)
*H01L 29/772* (2006.01)
*H01L 27/088* (2006.01)
*H01L 27/092* (2006.01)

(52) U.S. Cl.
CPC ............ *H01L 27/088* (2013.01); *H01L 27/092* (2013.01)
USPC ... 257/342; 257/343; 257/E27.06; 257/E29.12; 257/E29.122; 257/E29.256

(58) Field of Classification Search
None
See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |

(Continued)

OTHER PUBLICATIONS

Definition of align downloaded from URL< http://www.merriam-webster.com/dictionary/align> on Jun. 11, 2014.*

(Continued)

*Primary Examiner* — Joseph Schoenholtz
(74) *Attorney, Agent, or Firm* — Winston Hsu; Scott Margo

(57) ABSTRACT

A power array with a staggered arrangement for improving on-resistance and safe operating area of a device is provided. Each power array includes two or more rows with a plurality of parallel device units arranged along the row. Each device unit includes a source region, a drain region, and a gate disposed between the source region and the drain region, wherein each drain region is offset from the adjacent drain region of adjacent rows in a row direction.

6 Claims, 2 Drawing Sheets

(56) References Cited

U.S. PATENT DOCUMENTS

| | | |
|---|---|---|
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,095,080 B2 | 8/2006 | Johansson |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 8,278,710 B2 * | 10/2012 | Khemka et al. ............... 257/339 |
| 2003/0022460 A1 | 1/2003 | Park |
| 2003/0209759 A1 * | 11/2003 | Blanchard .................... 257/341 |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |
| 2011/0115029 A1 * | 5/2011 | Van Den Boom ............ 257/369 |

OTHER PUBLICATIONS

Wen-Yi Chen, Ming-Dou Ker, "New Layout Arrangement to Improve ESD BRobustness of Large-Array High-Voltage nLDMOS", IEEE Electron Device Letters, vol. 31, No. 2, pp. 159-160, Feb. 2010.*

Brisbin, D., Strachan, A., Chaparala, P., "1-D and 2-D Hot Carrier Layout Optimization of n-LDMOS Transistor Arrays", IEEE IRW Final Report, pp. 120-124, (2002).*

* cited by examiner

US 8,941,175 B2

POWER ARRAY WITH STAGGERED ARRANGEMENT FOR IMPROVING ON-RESISTANCE AND SAFE OPERATING AREA

BACKGROUND OF THE INVENTION

1. Field of the Invention

The present invention relates generally to a power array, and more particularly, to a power array with a staggered arrangement for improving on-resistance (RDSon) and safe operating area (SOA).

2. Description of the Prior Art

Following the semiconductor industry development with time, high voltage devices have been widely applied in many electronic systems. These high voltage devices with various voltage levels are implemented as LDMOS, CMOS or DEMOS devices included in integrated circuits (IC). For example, low, intermediate and high power devices may be provided in ICs. Low power devices may be used in complementary metal oxide semiconductor (CMOS) for logic circuitry, intermediate voltage devices for analog circuitry and high power devices for high voltage output interfaces. It is desirable for high voltage devices to have a fast switching speed. The performances of such devices depend on, for example, the on resistance (RDSon) and the drain to source breakdown voltage.

For a good voltage array device, it is appreciated that the device shows good switching characteristics (ex. Low RDSon) and a widened safe operating area (SOA). Especially in the case of bigger array devices, thermal problem always impact the reliability of the device, so a widen SOA may ensure that no burn-out issue occur in the active area.

Moreover, the breakdown voltage and the on-resistance of the high voltage device are generally inversely related. There is a tradeoff between the breakdown voltage and the on-resistance. How to improve the breakdown voltage while maintaining a low on-resistance becomes a challenge.

Accordingly, a primary goal of the voltage device design is to minimize the RDSon while maintaining a high breakdown voltage and a robust SOA over the current and voltage operating area.

SUMMARY OF THE INVENTION

To obtain low on-resistance (RDSon) and a widen safe operating area (SOA), a power array with a novel and staggered arrangement is provided in the present invention. The staggered arrangement of device units in the present invention may gain a larger distance between adjacent drain regions, thereby suppressing the heat accumulation in the device, especially in the drain region. The burn-out voltage and the safe operating area are accordingly increased.

The object of the present invention is to provide a power array with a staggered arrangement for the improving on-resistance and safe operating area. The power array includes two or more rows. Each row includes a plurality of parallel device units arranged along the row. Each device unit includes a source region, a drain region, and a gate disposed between the source region and the drain region, wherein each drain region is offset in a row direction from the adjacent drain region of the adjacent row.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
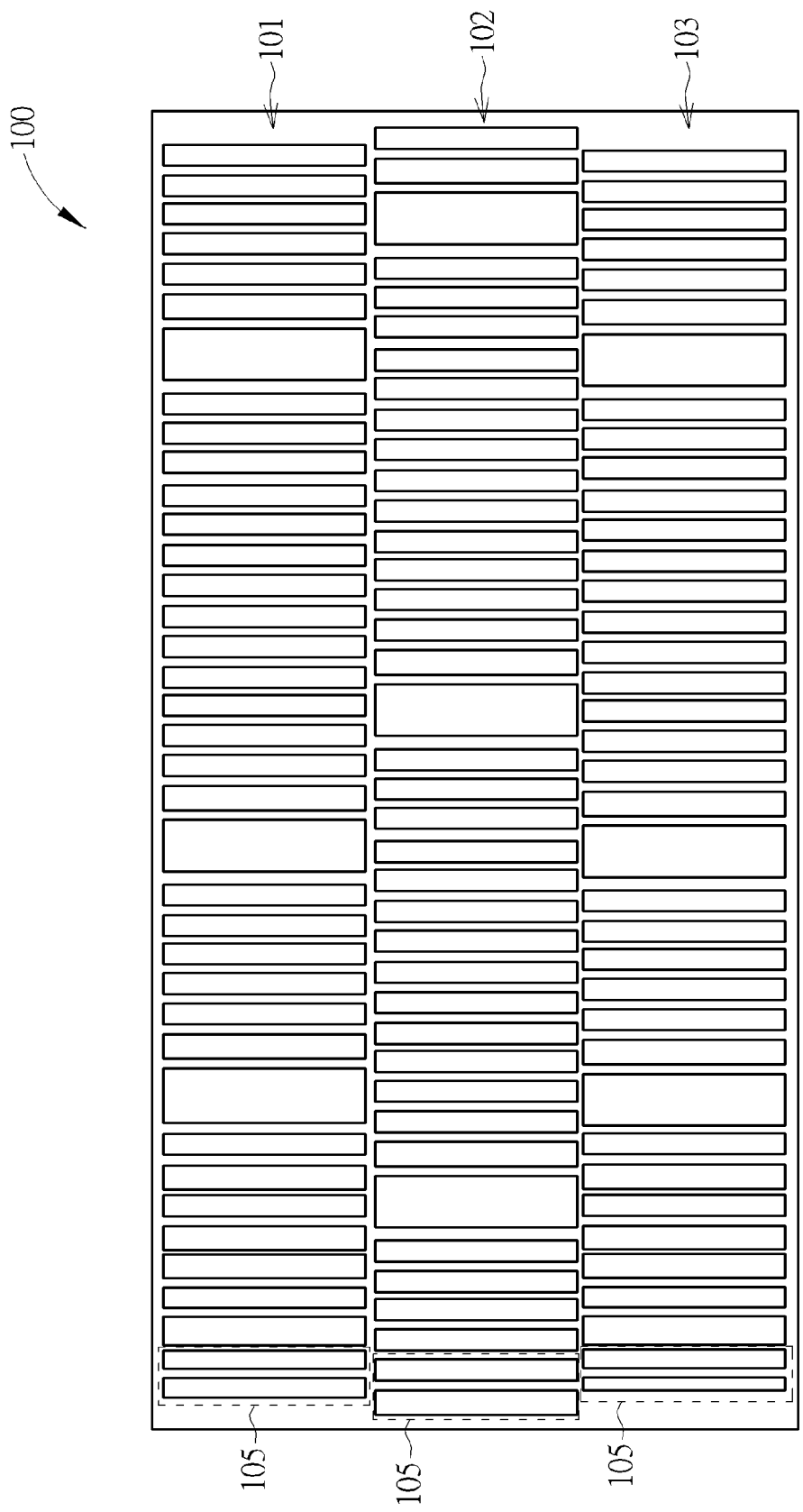
FIG. 1 is a top view schematically illustrating a power array with two rows, wherein each row has a plurality of parallel device units in a staggered arrangement in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference numerals are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The embodiments will now be explained with reference to the accompanying drawings to provide a better understanding to the structure of the present invention. First, as shown in FIG. 1, a power array 100 is provided with at least two device rows in a staggered arrangement (in this embodiment, three device rows 101/102/103 are shown in FIG. 1). Each device row further includes a plurality of parallel device units 105, such as LDMOS, FDMOS, CMOS or DEMOS, arranged along the device row.

Figure 2:
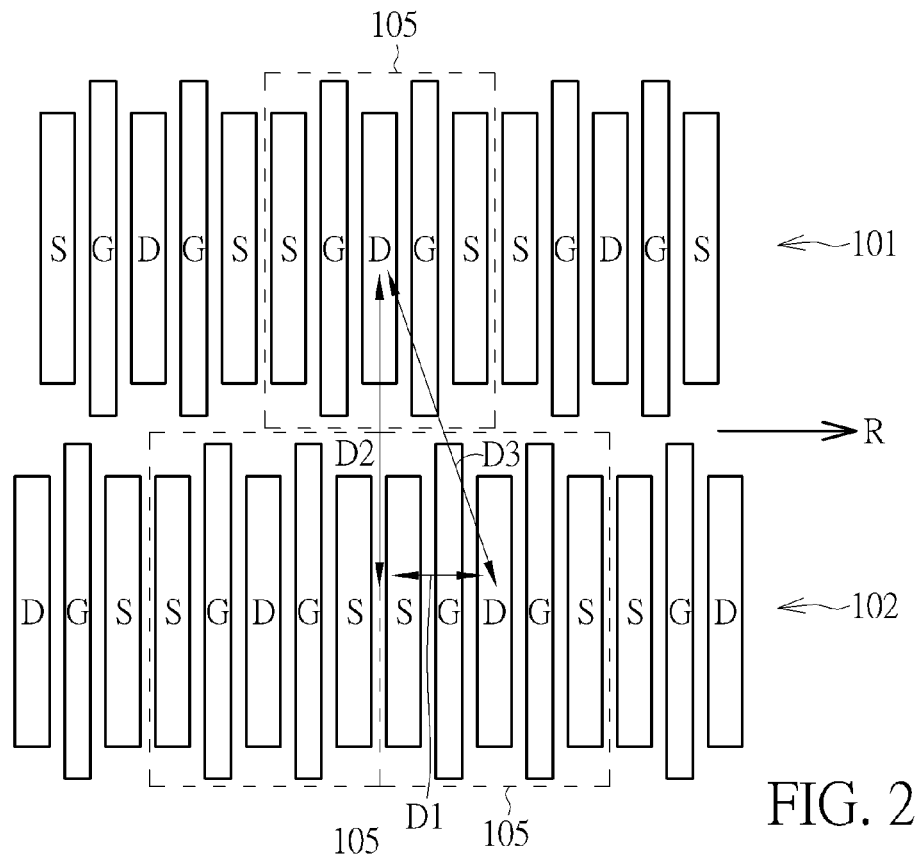
FIG. 2 is an enlarged top view of FIG. 1 schematically illustrating the components of each device unit in the device row and the aspect of the staggered arrangement between two device rows.

Please refer now to FIG. 2. FIG. 2 is an enlarged top view of FIG. 1 schematically and clearly illustrating the components of each device unit 105 in adjacent device rows 101 and 102 and the aspect of the staggered arrangement between these two device rows. As shown in FIG. 2, both device rows 101 and 102 include a plurality of parallel device units 105 (shown in the dashed block) arranged along the device row, and each device unit extends in a direction perpendicular to the row direction R. In the preferred embodiment, each device unit 105 is composed of a central drain region (D), two gate regions (G, one may be referred as a 2nd gate region) at both sides of the drain region (D), and two source regions (S, one may be referred as a 2nd source region) at two edges of the device units 105, such as parallel, finger-type gates, sources or drains. The gate region (G) is intervening between the drain region (D) and the source regions (S). For the simplicity of the drawing, only the components of source, drain and gate are shown in FIG. 2. The device unit 105 may includes other components, such as interconnections, contacts, n+ or n-drift regions, STIs, epitaxy layers, dielectric layers or other diffusion or doped regions (not shown).

In a conventional power array arrangement, each device row is aligned exactly with the other. That is, the gate region, source region, and drain region of one device row are aligned respectively with the corresponding gate region, source region, and drain region of other device rows in the power array. In comparison thereto, the most significant technical feature of present invention is that the drain region in one device row is offset in a row direction R from adjacent drain region of adjacent device rows. For example, as shown in FIG. 2 the drain region (D) of the device row 101 is offset from the drain region (D) of the device row 102 by a distance D1 in the row direction R. The offset of the distance D1 will increase the actual distance between the drain region (D) of the device row 101 and the drain region (D) of the device row 102 (measured from the center of drain regions) from D2 to D3. Preferably, in the present invention, the drain region (D) of device row 101 with such offset arrangement of power array 100 will be aligned with the border between two adjacent device units 105 of the device row 102. In such a staggered arrangement, the actual distance D3 between two adjacent drain regions (D) is maximized.

Figure 3:
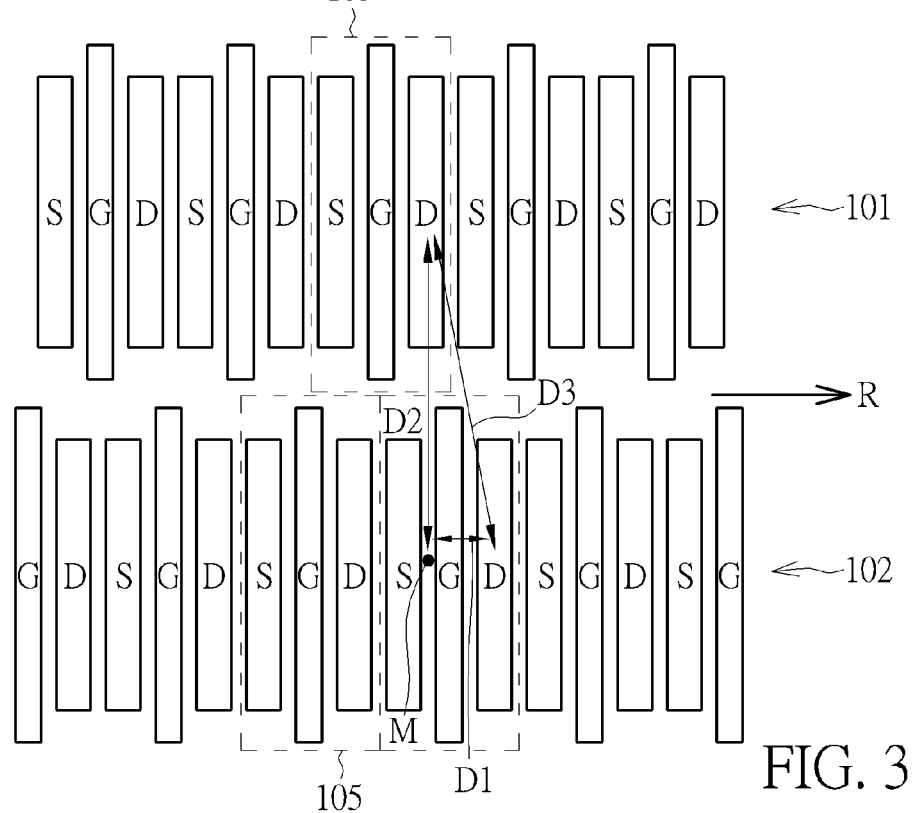
FIG. 3 is an enlarged top view of FIG. 1 schematically illustrating the components of each device unit in the device row and another aspect of the staggered arrangement between two device rows.

Alternative, the device unit 105 may have different composition in other embodiment, not limited to the arrangement shown in FIG. 2. Please refer to FIG. 3, which is an enlarged top view of FIG. 1 schematically and clearly illustrating another aspect of the staggered arrangement between these two device rows. As shown in FIG. 3, the device unit 105 in this embodiment is composed only of a source region (S), a drain region (D), and a gate region (G) disposed between the source region (S) and the drain region (D). Preferably, in this embodiment, the drain region (D) of device row 101 with such offset arrangement will be aligned with the midpoint (M) between adjacent source region (S) and gate region (G) of adjacent device row 102. In such a staggered arrangement, the actual distance D3 between two adjacent drain regions (D) is maximized.

The drain region (D) is the most vulnerable area in a MOS device which is subject to burn-out issues under high voltage or current operation. By offsetting the drain regions in the power array, the actual distance between adjacent drain regions may be increased, thereby effectively suppressing the heat accumulation. The burn-out voltage and the safe operating area (SOA) are accordingly increased. The on-resistance (RDSon) may also be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power array with a staggered arrangement for improving on-resistance and safe operating area, comprising:
    two or more rows, wherein each said row comprises a plurality of parallel device units arranged along said row, each said device unit comprises a source region, a drain region, and a gate disposed between said source region and said drain region, wherein each said drain region is offset in a row direction from adjacent said drain region of adjacent said row, and each said gate is offset in said row direction from adjacent said gate of adjacent said row.

2. A power array with staggered arrangement for improving on-resistance and safe operating area according to claim 1, each said device unit further comprises a 2nd source region and a 2nd gate region, wherein said drain region is disposed at the center of said device unit, said gate region and said 2nd gate region are disposed respectively at both sides of said drain region, and said source region and said 2nd source region are disposed respectively at the edges of said device unit.

3. A power array with staggered arrangement for improving on-resistance and safe operating area according to claim 2, wherein each said drain region is aligned with the border between two adjacent said device units of adjacent said TOW.

4. A power array with staggered arrangement for improving on-resistance and safe operating area according to claim 1, wherein each said drain region is aligned with the midpoint between adjacent said source region and said gate region of adjacent said row.

5. A power array with staggered arrangement for improving on-resistance and safe operating area according to claim 1, wherein said device unit extends in a direction perpendicular to said row direction.

6. A power array with staggered arrangement for improving on-resistance and safe operating area according to claim 1, wherein said device unit comprises LDMOS, CMOS or DEMOS.

* * * * *